(12) United States Patent
Chang

(10) Patent No.: US 7,259,616 B2
(45) Date of Patent: Aug. 21, 2007

(54) METHOD FOR SINGLE-ENDED OFFSET COMPENSATION OF AN OPERATIONAL AMPLIFIER

(75) Inventor: Yao Sheng Chang, Taipei (TW)

(73) Assignee: Princeton Technology Corporation, Taipei (TW)

( * ) Notice: Subject to any disclaimer, the term of this patent is extended or adjusted under 35 U.S.C. 154(b) by 232 days.

(21) Appl. No.: 11/128,250

(22) Filed: May 13, 2005

(65) Prior Publication Data

US 2006/0232335 A1     Oct. 19, 2006

(51) Int. Cl.
*H03F 1/02*     (2006.01)
*H03F 3/45*     (2006.01)
(52) U.S. Cl. .......................................... 330/9; 330/259
(58) Field of Classification Search .................. 330/9, 330/258, 259, 301; 327/307
See application file for complete search history.

(56) References Cited

U.S. PATENT DOCUMENTS 6,882,218 B2 *     4/2005     Gupta ........................... 330/9

\* cited by examiner

*Primary Examiner*—Steven J. Mottola
(74) *Attorney, Agent, or Firm*—Birch, Stewart, Kolasch & Birch, LLP

(57) ABSTRACT

The present invention provides a method for single-ended compensation of an operational amplifier, which comprises: designing an operational amplifier having a single-ended offset style, preparing a common-mode circuit, a switch circuit, a comparator, a digital circuit and a compensation circuits. When a single-ended offset voltage of the operational amplifier is converted, output of the comparator will change state and will be detected by the digital circuit, so that the digital circuit will fix a group of digital signals, and instruct the switch circuit to block an average signal of the common-mode circuit, allowing a set of double-end input signals to be inputted to the operational amplifier directly.

3 Claims, 7 Drawing Sheets

METHOD FOR SINGLE-ENDED OFFSET COMPENSATION OF AN OPERATIONAL AMPLIFIER

FIELD OF THE INVENTION

The present invention relates to an improvement of operational amplifier, and more particularly to a method for single-ended offset compensation of an operational amplifier.

BACKGROUND OF THE INVENTION

Referring to FIG. 1, which shows the offset phenomenon of an operational amplifier. A signal $V_o$ symmetrical to zero voltage is inputted to the operational amplifier 1, an ideal output should be a signal $AmpV_o$ symmetrical to zero voltage (as shown on the top right of FIG. 1), "Amp" represents the amplification factor of the operational amplifier 1. However, the real output will often be $AmpV_o+V_{offset}$ (as shown on the bottom right of FIG. 1) which is deviated from the zero votage due to some design or manufacturing defects of the operational amplifier 1. $V_{offset}$ is the offset generated by the operational amplifier 1.

Due to the manufacturing deviation of the operational amplifier 1, sometimes the value of the $V_{offset}$ is positive, but sometimes it is negative, so it will have an unpredictable influence over the circuit connected to the operational amplifier 1.

The present invention has arisen to mitigate and/or obviate the afore-described disadvantages.

SUMMARY OF THE INVENTION

The primary objective of the present invention is to provide a method for single-ended compensation of an operational amplifier, which comprises: designing an operational amplifier having a single-ended offset style, preparing a common-mode circuit, a switch circuit, a comparator, a digital circuit and a compensation circuit;

wherein a set of double-end input signals of the operational amplifier is initially inputted to the common-mode circuit and the switch circuit, and then the common-mode circuit will generate an average signal that will be transmitted to the operational amplifier via the switch circuit;

outputs of the operational amplifier will generate a single-ended offset voltage which is inputted to the comparator, so that the comparator will generate an initial output to trigger the digital circuit;

the digital circuit will generate a group of digital signals to make the compensation circuit generate a compensation current;

the compensation current is provided to the operational amplifier to compensate the single-ended offset voltage of the operational amplifier;

when the single-ended offset voltage of the operational amplifier is converted, the output of the comparator will change state and will be detected by the digital circuit, so that the digital circuit will fix the group of the digital signals and instruct the switch circuit to block the average signal of the common-mode circuit, allowing the set of double-end signals to be inputted to the operational amplifier directly.

The present invention will become more obvious from the following description when taken in connection with the accompanying drawings, which show, for purpose of illustrations only, the preferred embodiment in accordance with the present invention.

DETAILED DESCRIPTION OF THE PREFERRED EMBODIMENT

Figure 1:
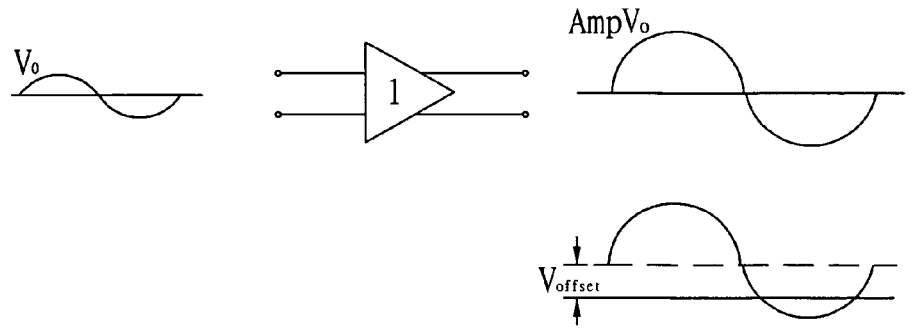
FIG. 1 shows the offset phenomenon of an operational amplifier.
Figure 2:
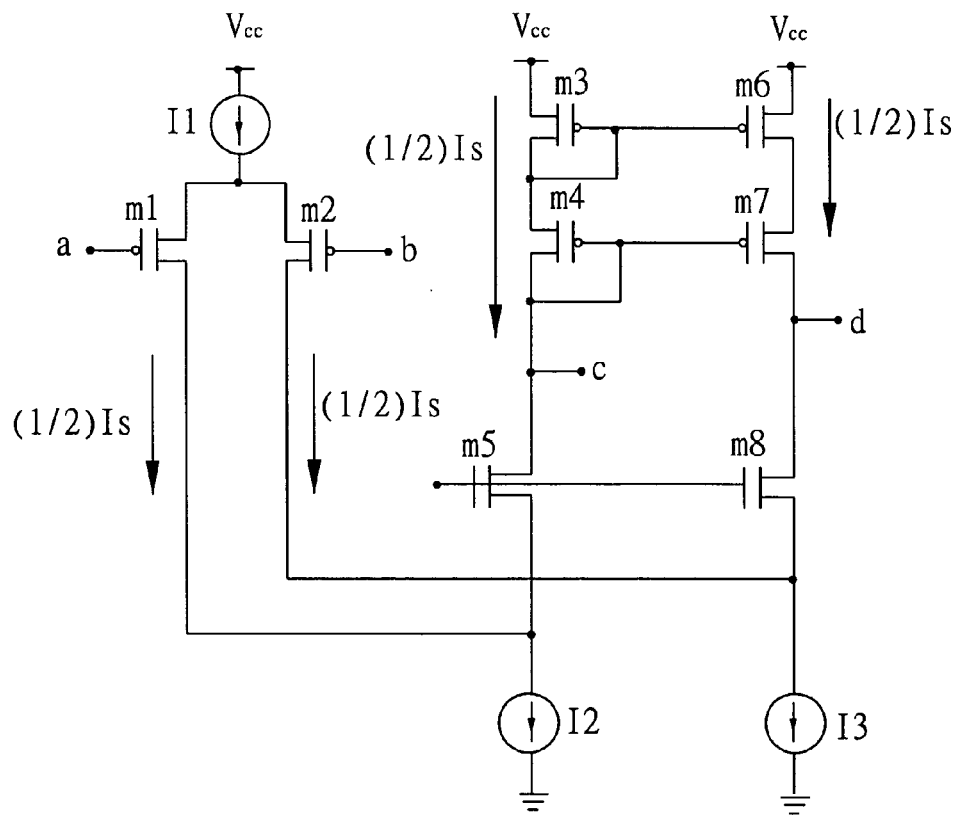
FIG. 2 is a circuit diagram of an operational amplifier.

Referring to FIG. 2, which is a circuit diagram of an operational amplifier 1 and includes a first differential amplifier and a second differential amplifier. The first amplifier comprises two MOS transistors m1 and m2, and the second amplifier comprises MOS transistors m3, m4, m5, m6, m7 and m8. Input signal Vin, Vip are inputted to the points "a" and "b" and output signals are outputted from the points "c" and "d". In an ideal condition, the current passing through the MOS transistors m1, m2 will be 1/s Is (Is=I1=I2=I3), and the current passing through the MOS transistors m3, m4, m5 and m6, m7, m8 will also be ½ Is. In this situation, the offset voltage $V_{offset}$ between the output points "c" and "d" is zero.

Figure 3:
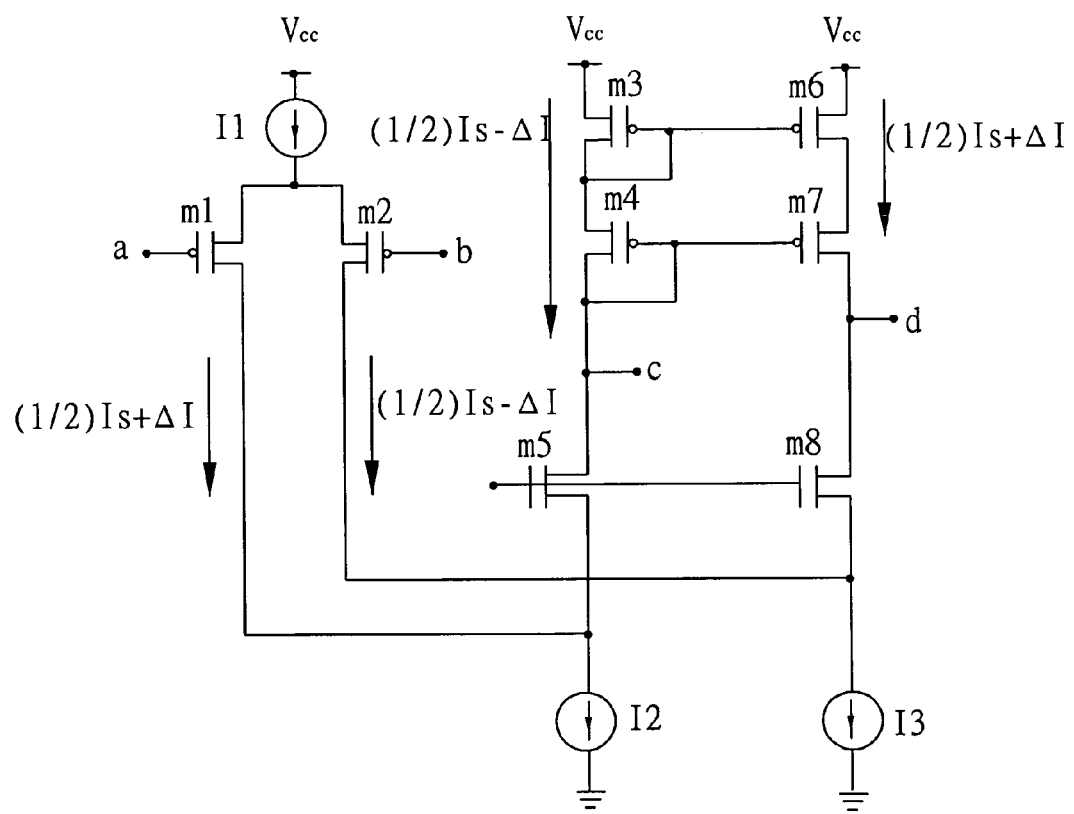
FIG. 3 is a circuit diagram of an operational amplifier with an offset voltage.

Referring to FIG. 3, which is a circuit diagram of an operational amplifier 1 with an offset voltage $V_{offset}$. The currents passing through the MOS transistors m1 and m2 are unbalanced, wherein the current of the MOS transistor m1 is ½ Is+ΔI, while the current of the MOS transistor m2 is ½ Is−ΔI. Consequently, the currents passing through the MOS transistors m3, m4, m5 and m6, m7 and m8 are unbalanced in such a manner the current of the MOS transistors m3, m4, m5 is ½ Is−ΔI and the current of the MOS transistors m6, m7 and m8 is ½ Is+ΔI. In this situation, an offset voltage $V_{offset}$ will be generated between the output points "c" and "d".

Figure 4:
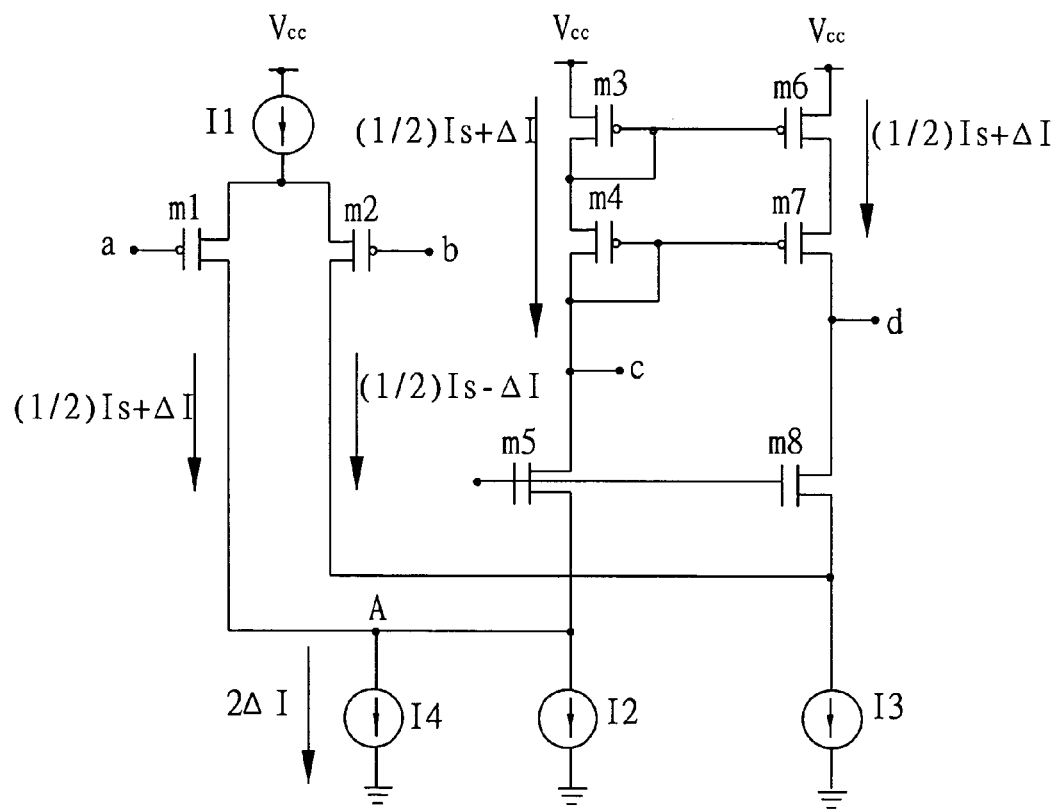
FIG. 4 is a circuit diagram of an operational amplifier with an offset compensation in accordance with the present invention.

Referring to FIG. 4, which is a circuit diagram of an operational amplifier 1 with an offset compensation. A current source I4 is connected to the point A and its current value is 2ΔI, and the current source I4 will be added to the current of MOS transistors m3, m4 and m5, so that the current of the MOS transistors m3, m4 and m5 will be changed from ½ Is−ΔI to ½ Is+ΔI that is equal to the current of the MOS transistors m6, m7 and m8. In this case, no offset voltage $V_{offset}$ will be generated between the output points "c" and "d".

Figure 5:
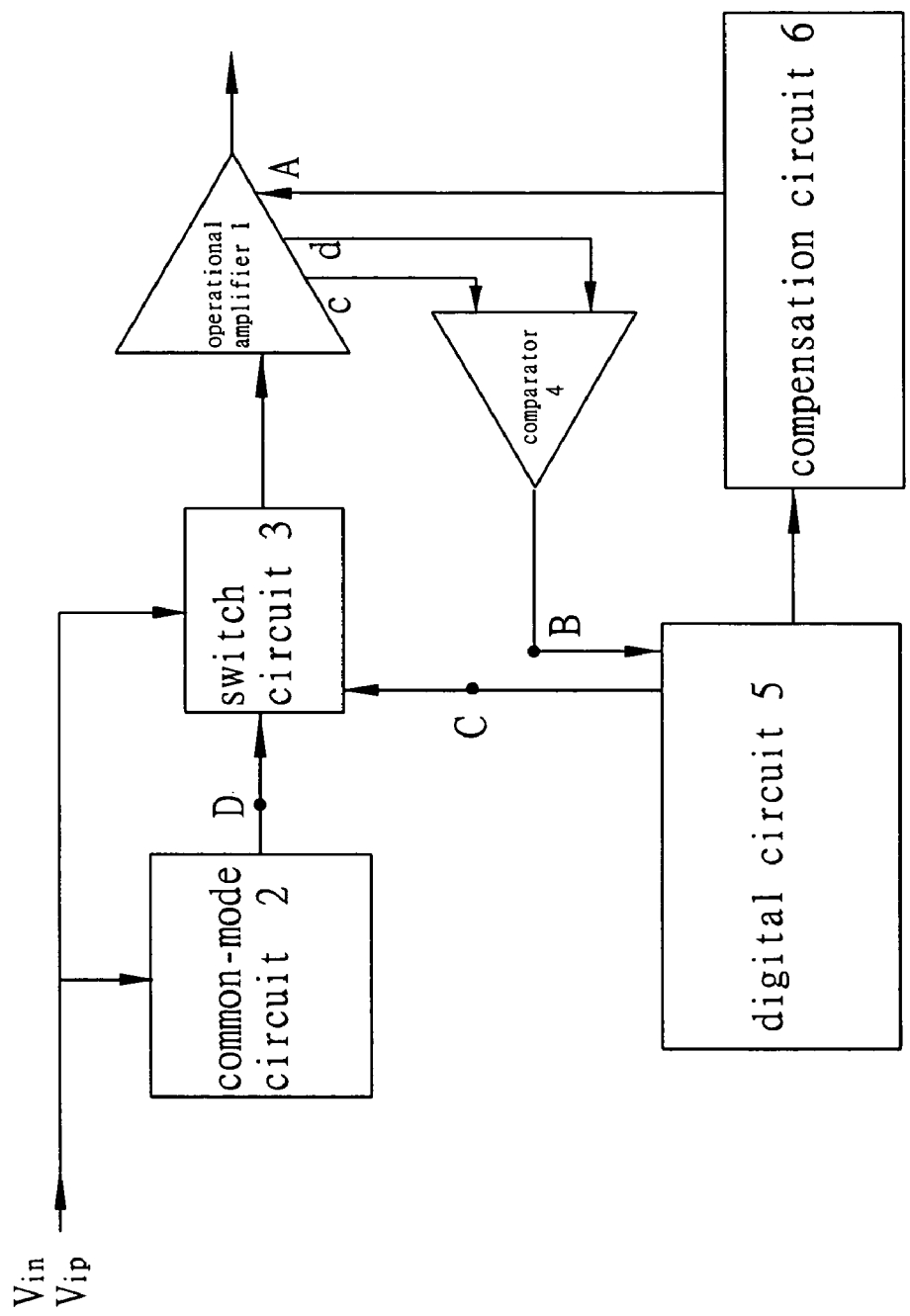
FIG. 5 is a block diagram of an operational amplifier with single-ended offset compensation in accordance with the present invention.

Referring to FIG. 5, which is a block diagram of an operational amplifier 1 with single-ended offset compensation in accordance with the present invention and comprises an operational amplifier 1, a common-mode circuit 2, a switch circuit 3, a comparator 4, a digital circuit 5 and a compensation circuit 6.

Conventionally, input signals Vin and Vip should be inputted to the operational amplifier 1, however, in the present invention, input signals Vin and Vip are initially inputted to the common-mode circuit 2 and the switch circuit 3. After the input signals Vin and Vip are inputted to the common-mode circuit 2, a signal (Vin+Vip)/2 will be generated by the common-mode circuit 2 and outputted from point D to the switch circuit 3, and then transmitted from the switch circuit 3 to the operational amplifier 1. Meanwhile, the switch circuit 3 will present the input signals Vin and Vip from inputting to operational amplifier 1.

The operational amplifier 1 is deliberately designed to be a single-ended offset circuit, for example, the currents I2 and I3 in FIG. 4 are deliberately designed to be different from each other. This can be achieved simply by making the sizes of the MOS transistors different with each other. When the operational amplifier 1 is designed to be a single-side offset circuit, a single-ended offset voltage will be generated apparently between the output points "c" and "d". The voltages of points "c" and "d" is inputted to the comparator 4, and the difference of the voltages of points "c" and "d" will cause the comparator 4 to generate output signal to trigger the digital circuit 5 through point "B", and thereafter for driving the compensation circuit 6.

The compensation circuit 6 acts as the current source I4 as shown in FIG. 4 and is connected to the operational amplifier 1 at the point A. As the current of the compensation circuit 6 increases, it will provide a compensation action for the offset voltage $V_{offset}$ of operational amplifier 1. Therefore, the offset voltage between the points "c" and "d" of the operational amplifier 1 will be reduced.

Once the offset voltage between the points "c" and "d" is converted, the output signal of the comparator 4 will accordingly change state, and the digital circuit 5 will detect this change and keep a group of digital signals of the digital circuit 5 constant. Meanwhile, the digital circuit 5 will control the switch circuit 3 via the point "C" so as to block the output signals (Vin+Vip)/2 of the common-mode circuit 2, while allowing the input signals Vin and Vip to be inputted to the operational amplifier 1 directly. Since the operational amplifier 1 has received the compensation from the compensation circuit 6, no offset voltage will be generated on the operational amplifier 1.

It is to be noted that the operational amplifier 1 is not a close circuit but an open circuit since it is provided with no feedback circuit.

Figure 6:
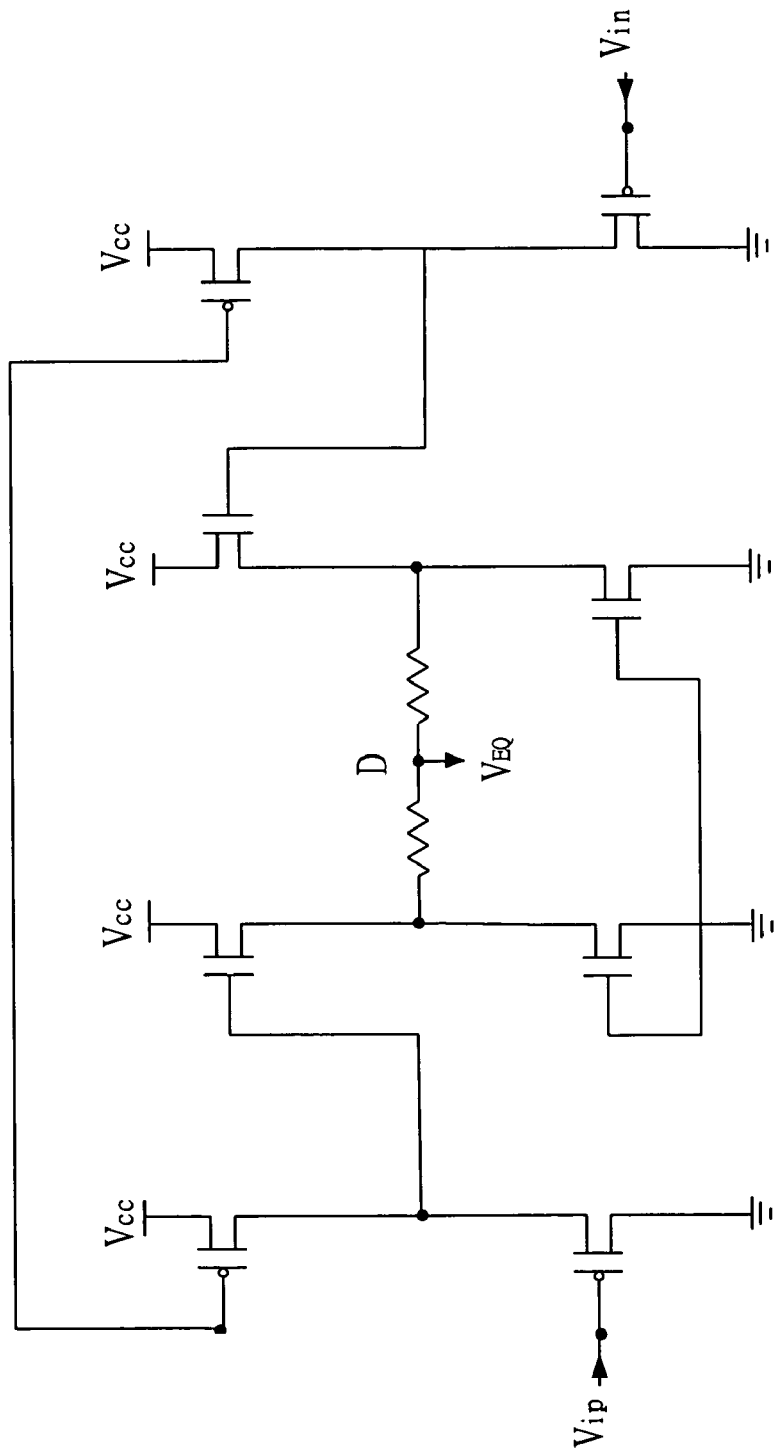
FIG. 6 shows the common-mode circuit in accordance with the present invention.

Referring to FIG. 6, which shows the common-mode circuit 2 which is a symmetrical MOS circuit. After it is inputted from both ends thereof with the input signals Vin and Vip, a signal $V_{EQ}$ will be generated at the point D, and the signal $V_{EQ}$=(Vin+Vip)/2. The average signal $V_{EQ}$ will then be transmitted to the operational amplifier 1 via the switch circuit 3. If the operational amplifier 1 is very ideal, no offset voltage $V_{offset}$ will be produced. However, the operational amplifier 1 is purposely designed to be a single-ended offset circuit, consequently, the signal $V_{EQ}$ will enable the operational amplifier 1 to generate an obvious offset voltage $V_{offset}$ initially.

Figure 7:
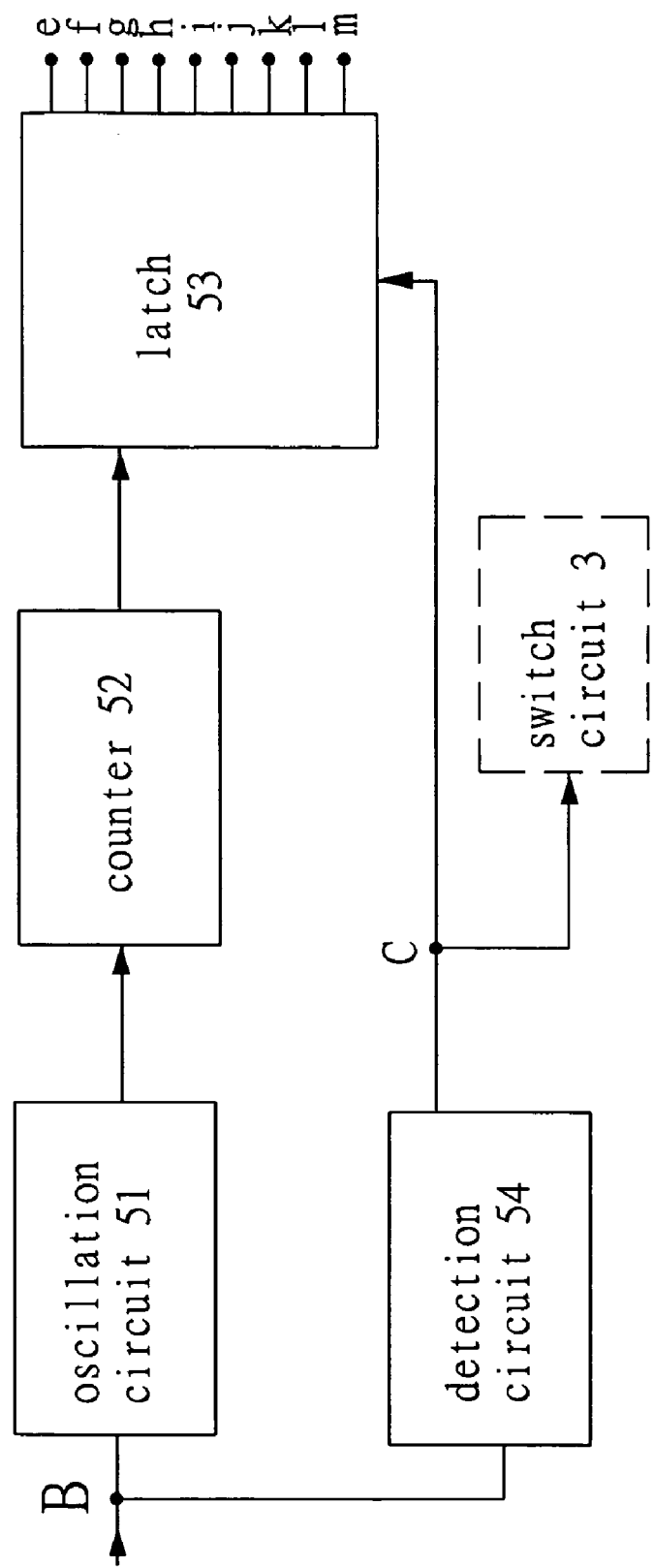
FIG. 7 shows a circuit diagram of the digital circuit in accordance with the present invention.

Referring to FIG. 7, which shows a circuit diagram of the digital circuit 5. The digital circuit 5 comprises an oscillation circuit 51, a counter 52, a latch 53 and a detection circuit 54. The initial output of the comparator 4 triggers the oscillation circuit 51 via the point "B", the counter 52 serves to count the oscillation time. As the oscillation time increases, the outputs e, f, g, h, i, j, k, l and m of the latch 53 will each generate a constant digital signal one by one gradually, for driving the compensation circuit 6. When the output of the comparator 4 change state, it will be detected by the detection circuit 54, so that a signal will be sent to lock the output state of the latch 53 and to make the switch circuit 3 block the output signals (Vin+Vip)/2 of the common-mode circuit 2, allowing the input signals Vin and Vip to be inputted to the operational amplifier 1 directly.

The oscillation circuit 51 can be replaced with a clock circuit on an IC chip.

Figure 8:
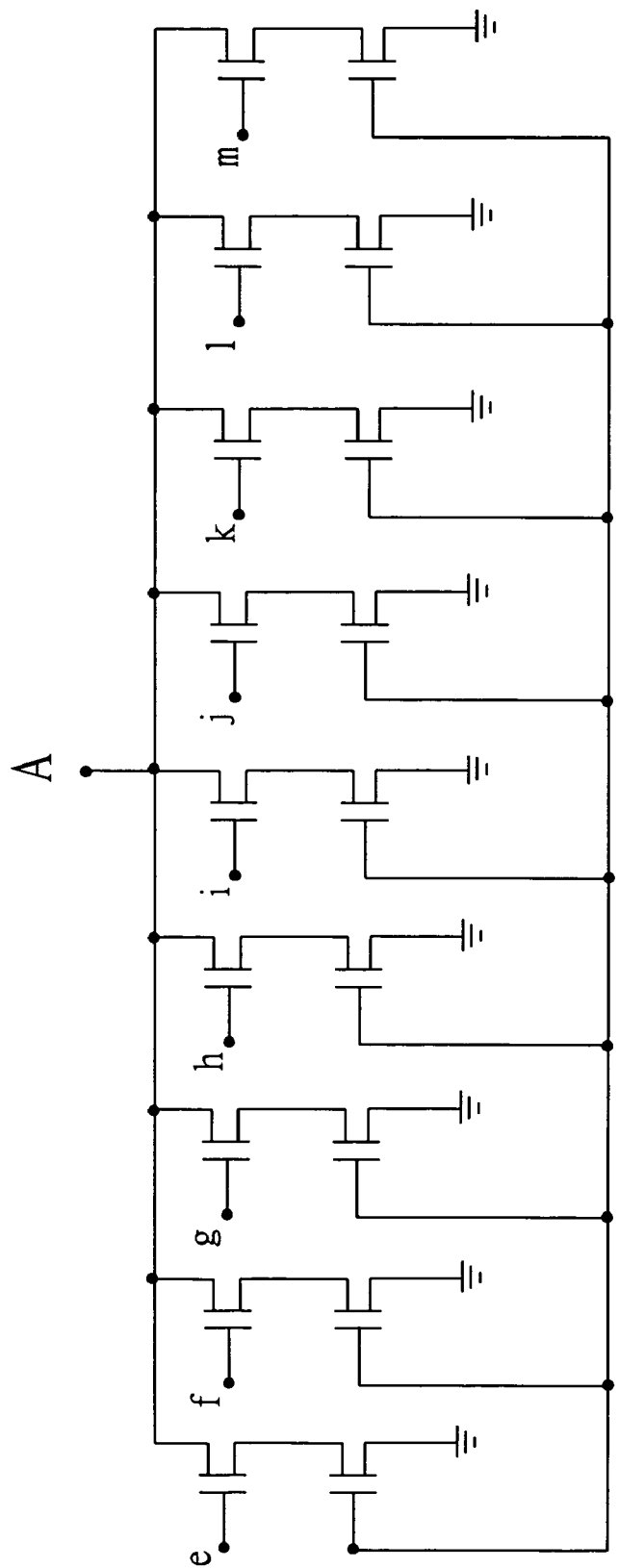
FIG. 8 shows a compensation circuit in accordance with the present invention.

Referring to FIG. 8, which shows a compensation circuit 6. The compensation circuit 6 comprises 9 sets of double MOS transistors that are connected in parallel. An end of the compensation circuit 6 is connected to the operational amplifier 1 via the point A, the outputs e, f, g, h, i, j, k l and m of the latch 53 are inputted to the gates of the 9 upper MOS transistors respectively, so as to turn on the respective upper transistors. The gates of the 9 lower MOS transistors are connected one another and controlled by a steady bias voltage. Once the upper MOS transistors are turned on, current will be allowed to flow through the lower MOS transistors. The outputs e, f, g, h, i, j, k, l and m of the latch 53 generate constant digital signal one by one gradually to turn on the respective upper MOS transistors. When the current generated by the parallel-connected MOS transistors is great enough, the operational amplifier 1 will be compensated, thus eliminating the offset voltage $V_{offset}$.

While we have shown and described embodiment in accordance with the present invention, it should be clear to those skilled in the art that further embodiments may be made without departing from the scope of the present invention.

What is claimed is:

1. A method for single-ended compensation of an operational amplifier, comprising: designing an operational amplifier having a single-ended offset style, preparing a common-mode circuit, a switch circuit, a comparator, a digital circuit and a compensation circuit;

wherein a set of double-end input signals of the operational amplifier is initially inputted to the common-mode circuit and the switch circuit, and then the common-mode circuit will generate an average signal that will be transmitted to the operational amplifier via the switch circuit;

outputs of the operational amplifier will generate a single-ended offset voltage which is inputted to the comparator, so that the comparator will generate an initial output to trigger the digital circuit;

the digital circuit will generate a group of digital signals to make the compensation circuit generate a compensation current;

the compensation current is provided to the operational amplifier to compensate the single-ended offset voltage of the operational amplifier;

when the single-ended offset voltage of the operational amplifier is converted, the output of the comparator will change state and will be detected by the digital circuit, so that the digital circuit will fix the group of digital signals and instruct the switch circuit to block the average signal of the common mode circuit, allowing the set of double-end input signals to be inputted to the operational amplifier directly.

2. The method for single-ended compensation of an operational amplifier as claimed in claim 1, wherein the digital circuit comprises an oscillation circuit, a counter, a latch and a detection circuit, an initial output of the comparator triggers the oscillation circuit, the counter serves to count oscillation time of the oscillation circuit, as the oscillation time increases, the latch will generate a group of digital signals one by one gradually, to drive the compensation circuit; when the output of the comparator changes state, it will be detected by the detection circuit, and the detection circuit will send out a signal to fix the states of the group of digital signals of the latch and to make the switch circuit block the average signal, allowing the set of double-end signals to be inputted to the operational amplifier directly.

3. The method for single-ended compensation of an operational amplifier as claimed in claim 2, wherein the compensation circuit comprises a plurality of MOS transistors that are connected in parallel, an end of the compensation circuit is connected to the operational amplifier and the group of digital signals of the digital circuit are inputted to gates of the MOS transistors respectively, so as to turn on the respective MOS transistors, when a current generated by the parallel-connected MOS transistors is great enough, the operational amplifier will be compensated, thus eliminating the single-ended offset voltage.

* * * * *